(12) United States Patent
Huang et al.

(10) Patent No.: US 7,241,558 B2
(45) Date of Patent: Jul. 10, 2007

(54) MULTI-LAYER SEMICONDUCTOR INTEGRATED CIRCUITS ENABLING STABILIZING PHOTOLITHOGRAPHY PROCESS PARAMETERS, THE PHOTOMASK BEING USED, AND THE MANUFACTURING METHOD THEREOF

(75) Inventors: Chong-Jen Huang, Sanchung (TW);
Hsin-Huei Chen, Miaoli (TW);
Kuang-Wen Liu, Nantou (TW);
Chih-Hao Wang, Taoyuan (TW);
Jia-Rong Chiou, Keelung (TW)

(73) Assignee: Macronix International Co., Ltd., Hsinchu (TW)

( * ) Notice: Subject to any disclaimer, the term of this patent is extended or adjusted under 35 U.S.C. 154(b) by 287 days.

(21) Appl. No.: 10/284,327

(22) Filed: Oct. 31, 2002

(65) Prior Publication Data

US 2004/0087181 A1    May 6, 2004

(51) Int. Cl.
*G03C 5/00* (2006.01)

(52) U.S. Cl. .................. 430/311; 430/312; 430/320
(58) Field of Classification Search ................ 430/311, 430/312, 320
See application file for complete search history.

(56) References Cited

U.S. PATENT DOCUMENTS

| 6,482,559 | B2 * | 11/2002 | Lin ........................ 430/30 |
| 2003/0088849 | A1 * | 5/2003 | Yamauchi ................ 716/19 |

* cited by examiner

*Primary Examiner*—Geraldina Visconti
(74) *Attorney, Agent, or Firm*—Rosenberg, Klein & Lee

(57) ABSTRACT

Stabilization of photolithography process parameters, the photomask being used, and the manufacturing method thereof is provided where a formal pattern layout is combined with a dummy pattern. A photomask is manufactured by utilizing the combined pattern layout so that density changes between the pattern structure layers of the multi-layer semiconductor integrated circuits are minimized.

18 Claims, 10 Drawing Sheets

MULTI-LAYER SEMICONDUCTOR INTEGRATED CIRCUITS ENABLING STABILIZING PHOTOLITHOGRAPHY PROCESS PARAMETERS, THE PHOTOMASK BEING USED, AND THE MANUFACTURING METHOD THEREOF

FIELD OF THE INVENTION

The present invention relates to a method used to stabilize a photolithography process in semiconductors. The invention especially relates to a method utilizing a dummy pattern to manufacture the integrated circuits of semiconductors, as well as the layout of a photomask being used to stabilize a photolithography process and to simplify the control of the photolithography process, which also makes the photolithography process smoother.

BACKGROUND OF THE INVENTION

As the integrated circuit industry progresses, the number of devices required to be allocated inside a chip grows continuously, with repeated doubling, which makes the line width shrink and shrink, such that the photolithography imaging also must be finer and finer. Thus, the minimum size of the patterns on the integrated circuits is always a representative pointer in the development history of the semiconductor technology.

However, most of today's semiconductor technology uses conventional optical methods. Since the electromagnetic characteristics of optics, limits the exposure line width, if we want a finer line width, we must use a light source with a shorter wavelength. The wavelength of the light source used in today's semiconductor industry is as short as 248 nm. The wavelength of these light sources reaches the limits of interference in some advance processes and the more complex Phase Shifting Mask Method must be used to accommodate the light source being used in advanced deep sub-micron processes.

Thus, it is known that the photolithography process is associated with the line width being exposed. This means that for a finer line width, the photolithography process with a shorter wavelength is required to avoid the diffraction phenomena, and an exact pattern is acquired. So if the light source with the same wavelength is used to expose the devices with various line widths, the exact exposure in some regions could be acquired, with some exceptions that there is a diffraction phenomenon in some regions. In addition to the special characteristic of the general logic device product line which makes use of various pattern densities of a multi-layer pattern structure, due to the variation of products, such variation of the pattern density between layers will cause a line width change which does not obey the specification of the line width error. There is also a deference of the photolithography process in the process of the same product, i.e., it is required to change the condition of the photolithography in each process. So, the engineers use fine-tuning of the photolithography process to conform to the requirements of the products in most conventional processes, which also causes problems in mass production and makes the mass production line increasingly more complex.

Thus, the present invention is directed to overcoming the drawback caused by fine-tuning of the photolithography process and avoid the problems in mass production of the conventional logic devices.

SUMMARY OF THE INVENTION

Therefore a main object of this invention is to provide a method which, by utilizing special and regular dummy patterns added to the formal pattern layout to increase the pattern density of the multi-layer semiconductor integrated circuits and the photomask being used, to solve the problem of conventional logic devices in mass production and achieve the purpose of stabilizing the photolithography process.

Another object of this invention is to decrease the variation of the multiple pattern structure density between the products, to simply the photolithography process and acquire a stable process.

To achieve the above-mentioned object, this invention comprises a formal pattern layout with a plurality of lines and there is an informal pattern space between each line, and the dummy pattern layout of a plurality of blocks, which are combined in the informal space, and are spaced apart from each adjacent line by a specified distance.

DETAILED DESCRIPTION OF THE PREFERRED EMBODIMENTS

This invention discloses a multi-layer semiconductor integrated circuits having a pattern structure combining a dummy pattern layout, the photomask being used, and the manufacturing method of the photomask of fusing the dummy pattern layout thereof, wherein a special and regular dummy pattern layout are added to the informal pattern space on the formal pattern layout, to increase the pattern density of the pattern structure layer by means of the disclosed method and to achieve the purpose of stabilizing the parameters in the photolithography process.

The product characteristic of general logic devices often causes variations of the pattern density of each layer of semiconductor integrated circuits, requiring a change of the lithography condition in each process, which not only makes the process more complex, but also the degree of stability of the process is influenced and often causes problems in mass production. To avoid this, the present invention combines the formal pattern layout layer with two different pattern densities with a dummy pattern layout and thus a pattern layer which obeys the requirements of the logic device products and is used to manufacture the photomask such that is applicable to the pattern density of the multi-layer semiconductor integrated circuits of various logic device without changing the process condition of photolithography.

Figure 1:
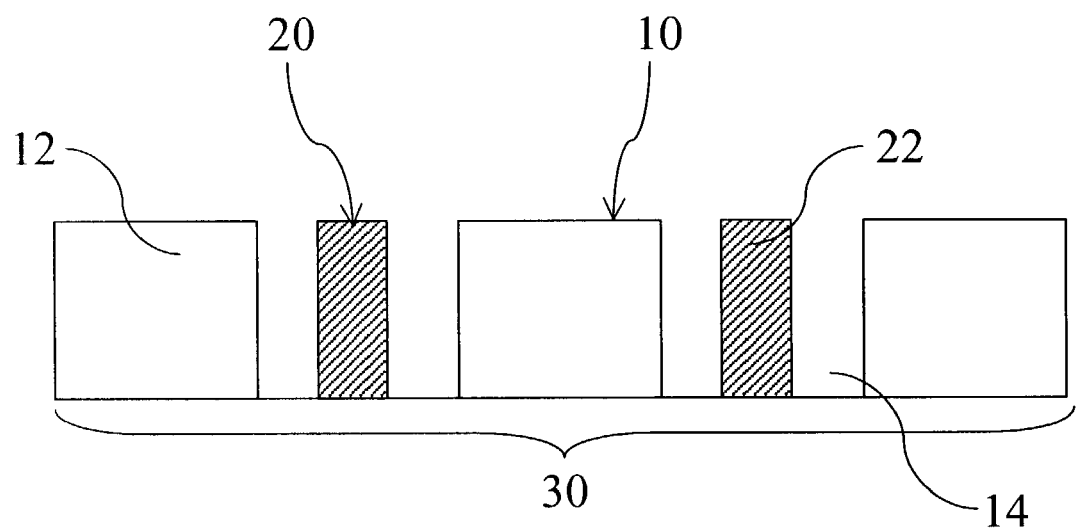
FIG. 1 is the cross-sectional view of the embodiment of the combined pattern structure layer according to the present invention.

To give a detailed description, the semiconductor integrated circuits provided by this invention is one with a multiple pattern structure wherein one of the pattern structure layers is comprised of a formal pattern layout and a dummy pattern. Refer to FIG. 1. The formal pattern layout 10 comprises a plurality of lines 12 and an informal pattern space 14 between each line 12. The dummy pattern layout 20 comprises a plurality of blocks 22 which are positioned within the informal pattern space 14 of the formal pattern layout 10 and are spaced apart from the lines 12 by a specified distance, wherein each block 22 is arranged within the informal pattern space 14. The above-mentioned formal pattern layout 10 and the dummy pattern layout 20 are comprised of the same material.

In addition to the multi-layer pattern structure of the semiconductor integrated circuits having the combined pattern structure layer, the photomask being used on manufacturing the semiconductor integrated circuits also has the same characteristic. In other words, the semiconductor integrated circuits photomask has a pattern structure wherein the pattern structure is comprised of a formal pattern layout 10 and a dummy pattern layout 20 which detail structure is the same as the integrated circuit.

Figure 2A:
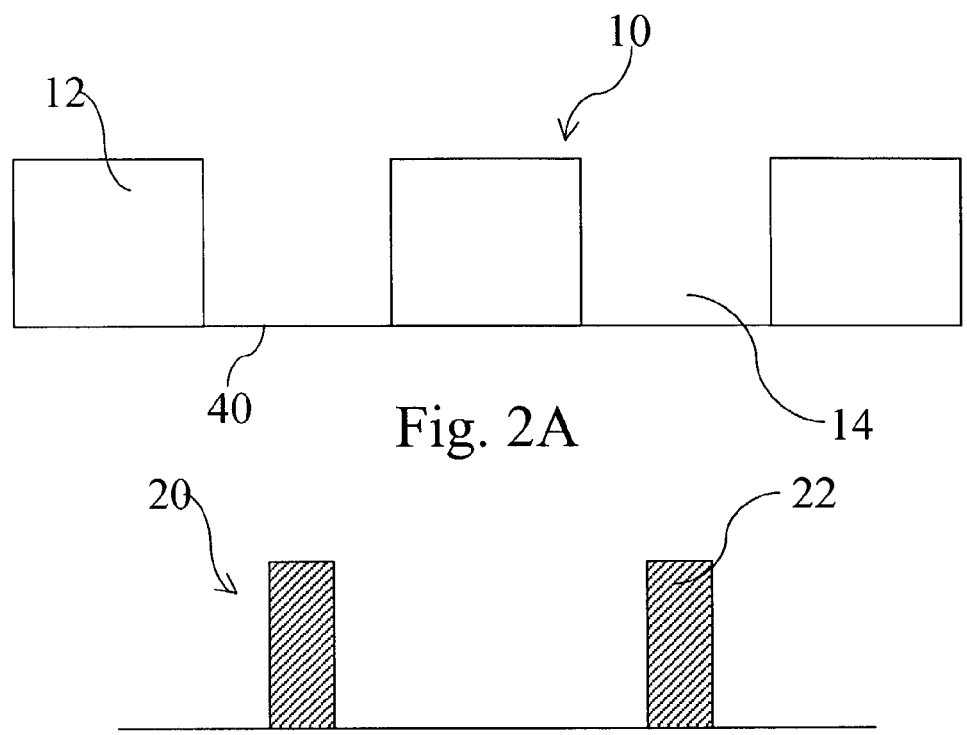
FIG. 2A, FIG. 2B and FIG. 2C are the cross-sectional views of the steps of manufacturing the photomask according to the present invention.
Figure 2B:
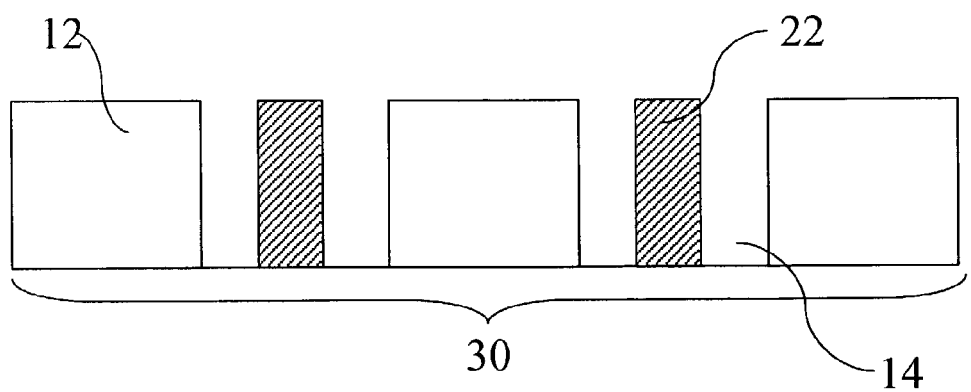
Figure 2C:
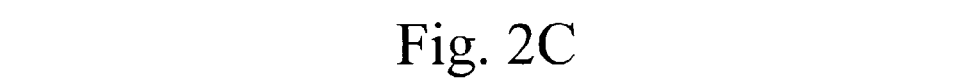

Next we explain the manufacture method of the semiconductor integrated circuits comprising the following steps. First, as shown in FIG. 2A, a layout 10 representing a formal pattern for manufacturing on a photomask 40 is provided with a plurality of lines 12, and there is an informal pattern space 14 between each line 12 within the scope of the photomask 40. Next please refer to FIG. 2B, a layout representing the dummy pattern is provided comprising a plurality of regularly arranged pattern block 22. Next, map the dummy pattern layout 20 onto a region covered by the photomask 40, and add the corresponding dummy pattern layout 20 with a specified distance from each line 12 in the informal pattern space 14 and complete a combined pattern layout 30, as shown in FIG. 2C. Finally, the combined pattern layout 30 is used to complete the manufacture of the photomask.

For example, a logic device product of the semiconductor integrated circuits has a three layer pattern structure wherein the density of the formal pattern layout of the pattern structure of the first layer is 64% (pattern/total area, dark/total), the density of the formal pattern layout of the pattern structure of the second layer is 52%, and the density of the formal pattern layout of the pattern structure of the third layer is 28%. Due to the variation of the pattern density between the layers of the multi-layer pattern structures, it could utilize the dummy pattern layout to fill the open informal pattern space of the pattern structure of the layers so that the variation of the pattern density between the layers of the three-layer pattern structure of the logic device product is lowered.

Let's take the manufacture of the first layer of pattern structure layer and the third layer of pattern structure layer as an example. The density of the formal pattern layout of the pattern structure layer of the third layer is 28%. In order to lower the variation of the pattern density between the first layer of the pattern structure and the third layer of the pattern structure, it must be laid out with a dummy pattern and the dummy pattern layout combined with the formal pattern layout of the third layer of pattern layer structure. The dummy pattern is added to the informal pattern space of the formal pattern layout such that the density of new combined pattern layout will increase from 28% to close to the required 64% and the same photolithography condition of the first pattern structure layer can then be put in use for the third pattern structure layer without any further change in the photolithography process condition. This way of utilizing the pattern layout photomask formed by a formal pattern layout in combination with a dummy pattern layout, to manufacture various pattern structure layers of semiconductor integrated circuits or logic devices with various products could avoid the problem of fine-tuning the photolithography process and further simply the photolithography process to provide a stable process.

Figure 3A:
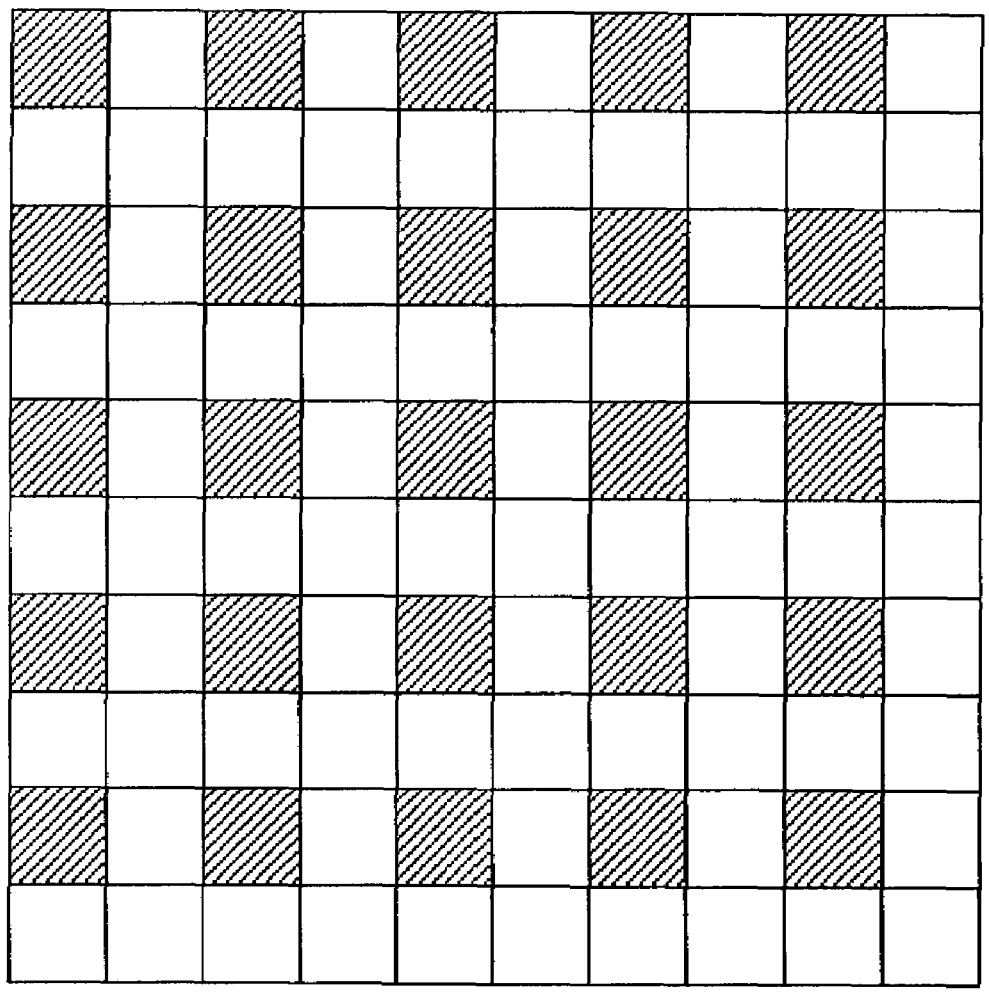
FIG. 3A through FIG. 3H are embodiments of the dummy pattern layout according to the present invention.
Figure 3B:
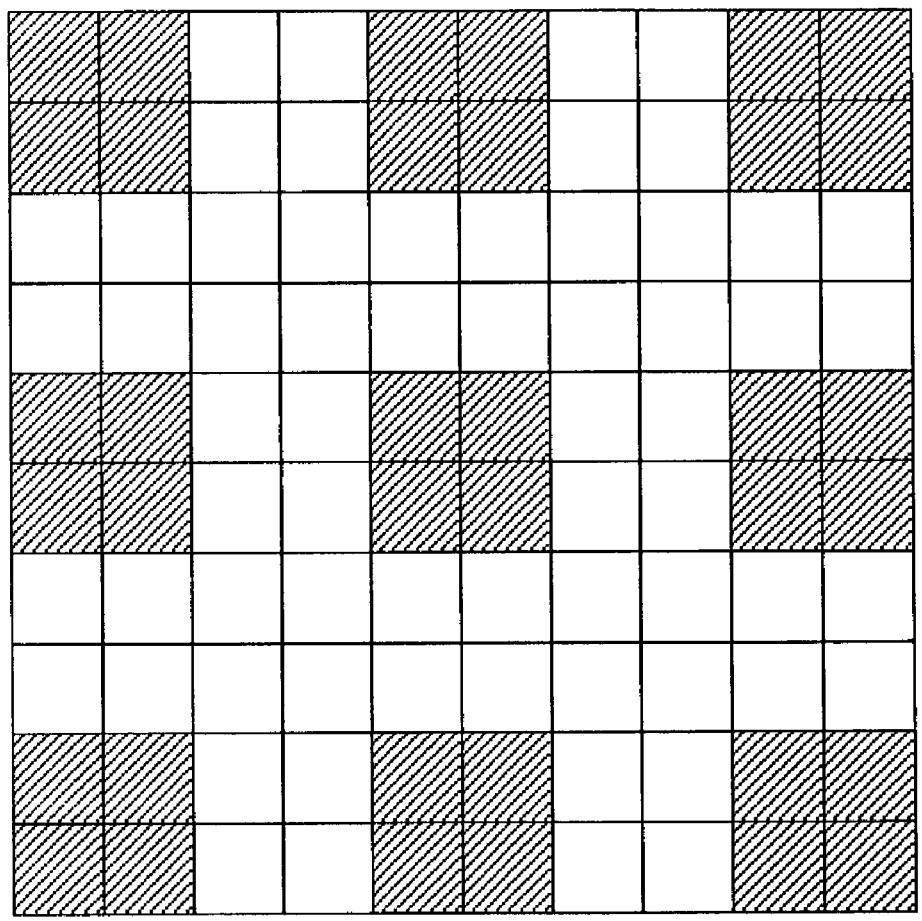
Figure 3C:
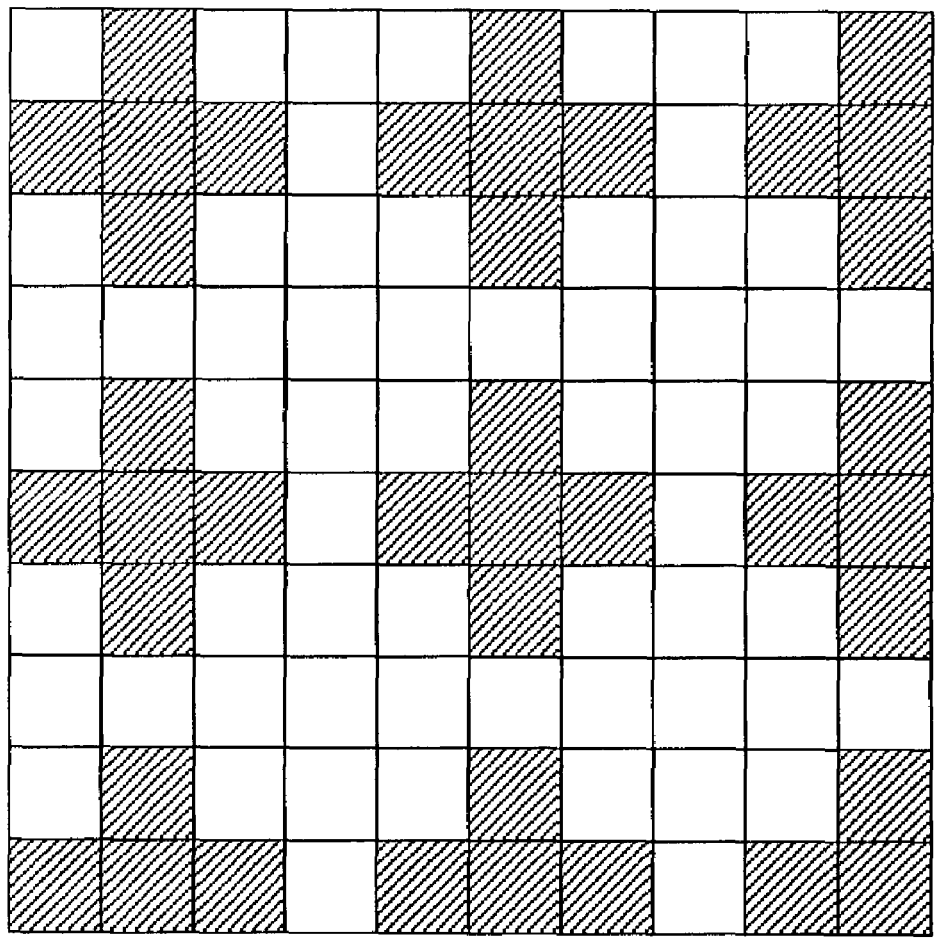
Figure 3D:
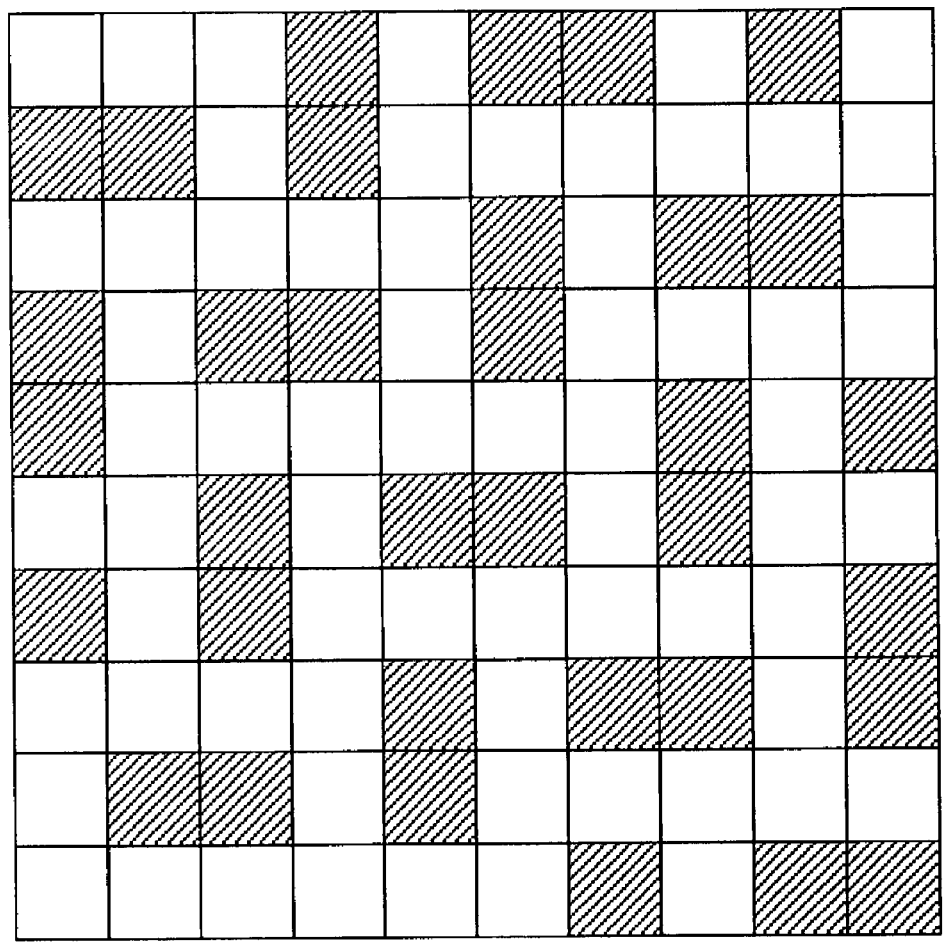
Figure 3E:
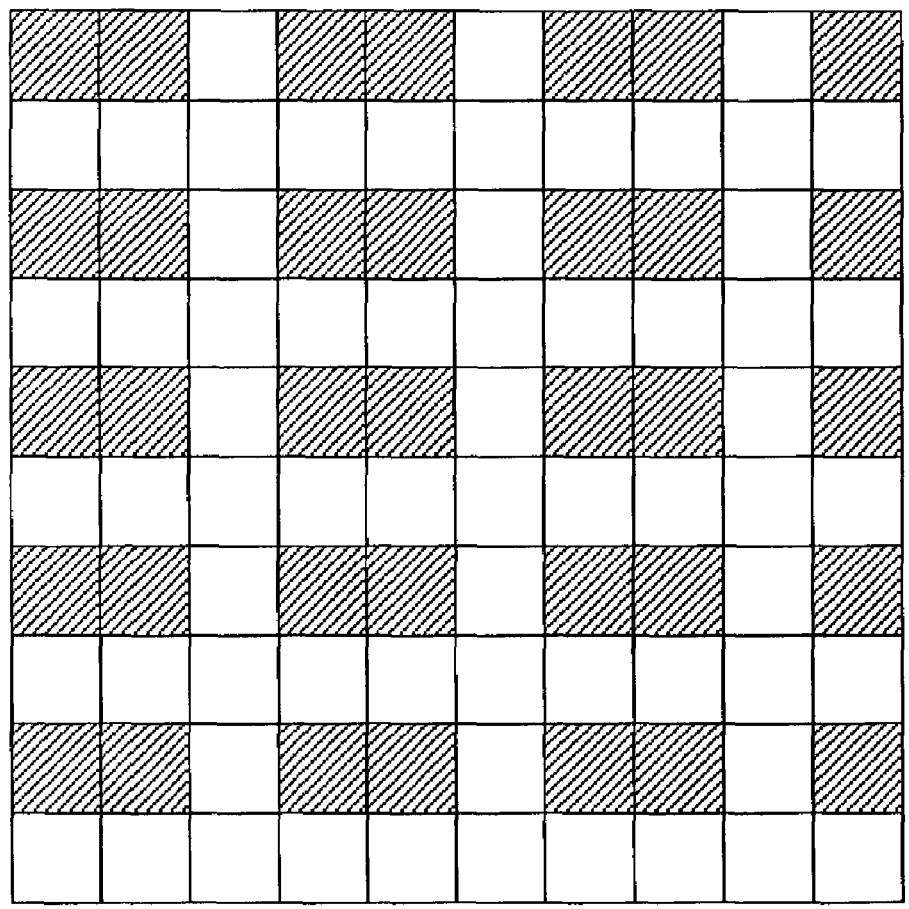
Figure 3F:
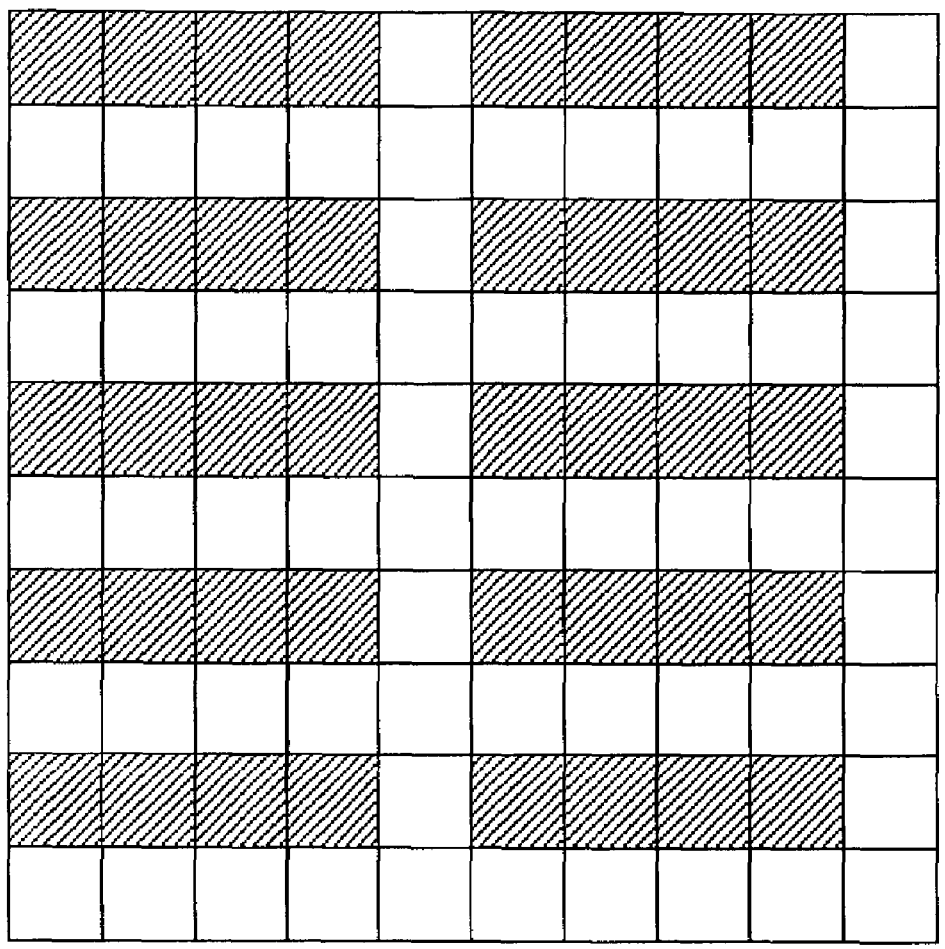
Figure 3G:
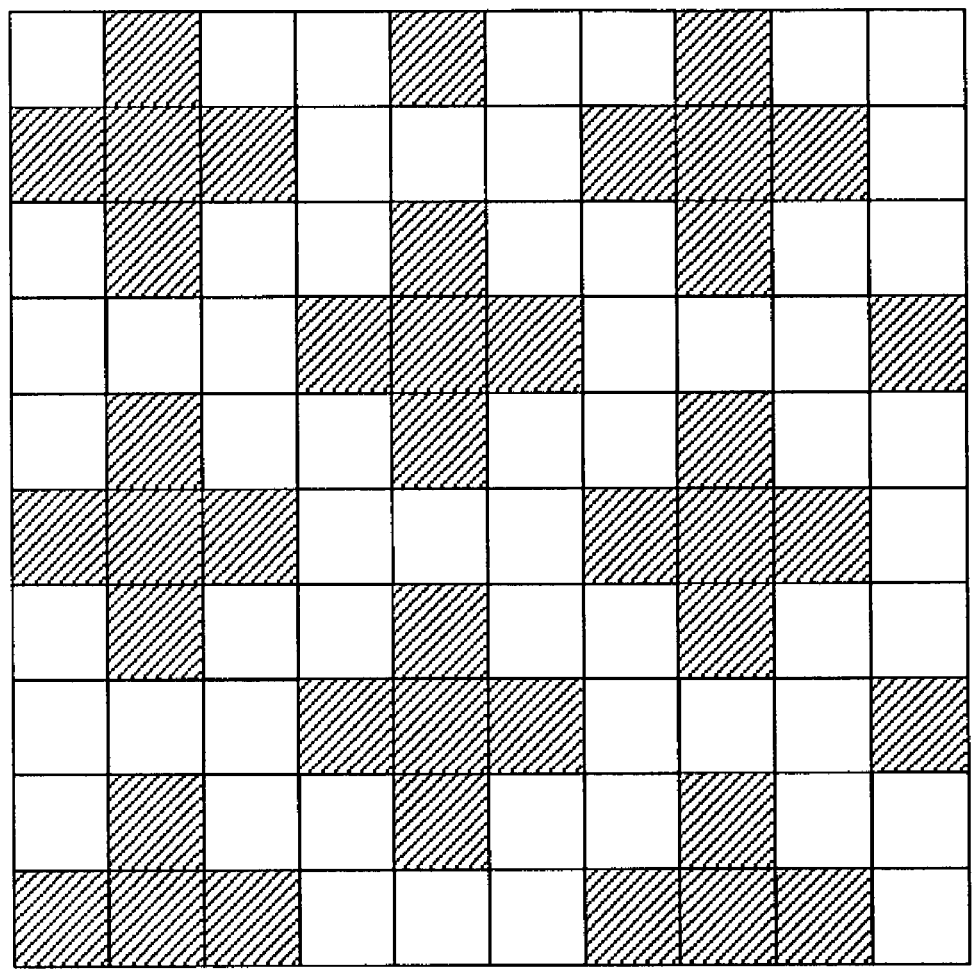
Figure 3H:
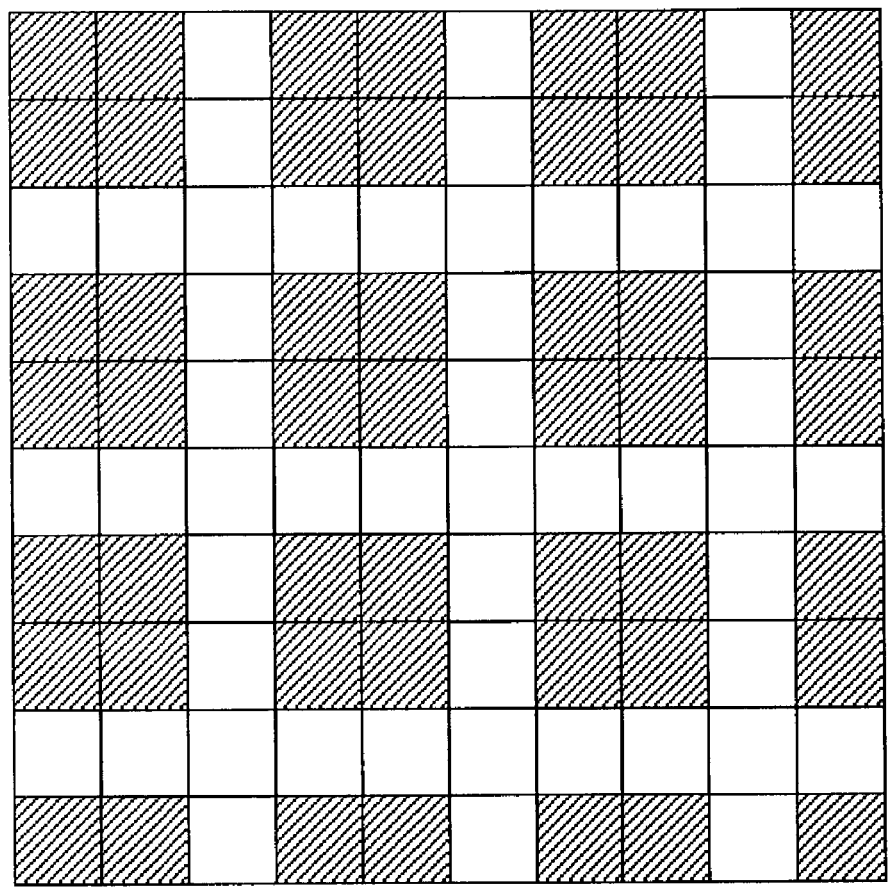

The block pattern of the above-mentioned dummy pattern layout 20 is comprised of a rectangular shaped block with the side length proportion being a 1:1 staggered arrangement, or is formed in a cross shape formed by staggering the rectangular block with the side length proportion of 2:1 arranged in a matrix arrangement. It could also be the pattern of cross shaped formed by staggering the rectangular block with the side length proportion of 3:1 arranged in a matrix arrangement. The proportion of the block pattern of the dummy pattern layout with each kind of arrangement pattern is between 25%~45% (pattern/total area, dark/total). Referring to FIG. 3A~3H, the pattern density in FIG. 3A is 25%; the pattern density in FIG. 3B is 25%; the pattern density in FIG. 3C is 31.25%; the pattern density in FIG. 3D is 33.3%; the pattern density in FIG. 3E is 33.5%; the pattern density in FIG. 3F is 40%; the pattern density in FIG. 3G is 41.66%; the pattern density in FIG. 3H is 44.4%, so that the user can select from various dummy pattern layouts according to the requirement of various logic products (multi-pattern structures).

Thus, this invention uses the addition of a dummy pattern layout to even the density of the multi-layer pattern structure, which not only lowers the variation of the pattern density of the logic product but also simplifies the parameters in the photolithography process and make the process more stable. Most importantly it solves problems of mass production of devices. After the dummy pattern layout is filled into the informal pattern space of the formal pattern layout, and thus greatly lower the density variation of the pattern structure between the products.

What is claimed is:

1. A semiconductor integrated circuit having a multi layer pattern structure and at least one of the pattern structure layers formed using a photomask comprising:
    a formal pattern structure having a plurality of lines and having an informal pattern space formed between neighboring lines of said plurality of lines; and
    a dummy pattern structure including a plurality of blocks disposed within said informal pattern space in a spaced relationship with each of said neighboring lines, the plurality of blocks of the dummy pattern structure corresponding to a block pattern of the photomask having an optical density within a range of 25%–45%.

2. The semiconductor integrated circuit as claimed in claim 1, wherein said dummy pattern structure is formed by a staggered arrangement of the plurality of blocks, each block being a rectangular shaped block with sides having a respective length in a 1:1 proportion.

3. The semiconductor integrated circuit as claimed in claim 1, wherein said dummy pattern structure is formed by a matrix arrangement of the plurality of blocks, each block having a cross shape formed by rectangular members with sides having a respective length in a 2:1 proportion.

4. The semiconductor integrated circuit as claimed in claim 1, wherein said dummy pattern structure is formed by a matrix arrangement of the plurality of blocks, each block having a cross shape formed by rectangular members with sides having a respective length in a 3:1 proportion.

5. The semiconductor integrated circuit as claimed in claim 1, wherein said dummy pattern structure is formed by a matrix arrangement of the plurality of blocks, each block being a rectangular member with sides having a respective length in a 2:1 proportion.

6. A semiconductor integrated circuit formed by a plurality of layers including a first layer and at least one second layer, each layer of said plurality of layers being formed by a respective photomask having a respective pattern layout defined thereon, said first layer being formed by a first photomask having only a formal pattern layout for forming structures, said formal pattern layout defining a first optical density of said first photomask, said at least one second layer being formed by a second photomask having a second optical density, said second photomask comprising:

a formal pattern layout having a plurality of lines and an informal pattern space formed between neighboring lines of said plurality of lines; and a dummy pattern layout including a plurality of block patterns disposed within said informal pattern space in a spaced relationship with said neighboring lines of the formal pattern layout, said formal pattern layout and said dummy pattern layout of said second photomask cumulatively forming said second optical density of said second photomask, thereby reducing a difference between said first and said second optical densities of said first and second photomasks respectively.

7. The semiconductor integrated circuit photomask as claimed in claim 6, wherein said dummy pattern layout is formed by a staggered arrangement of the plurality of block patterns, each block pattern being a rectangular shaped block with sides having a respective length in a 1:1 proportion to define a predetermined optical density for said dummy pattern layout.

8. The semiconductor integrated circuit photomask as claimed in claim 6, wherein said dummy pattern layout is formed by a matrix arrangement of the plurality of block patterns, each block pattern having a cross shape formed by rectangular patterns with sides having a respective length in a 2:1 proportion to define a predetermined optical density for said dummy pattern layout.

9. The semiconductor integrated circuit photomask as claimed in claim 6, wherein said dummy pattern layout is formed by a matrix arrangement of the plurality of block patterns, each block pattern having a cross shape formed by rectangular patterns with sides having a respective length in a 3:1 proportion to define a predetermined optical density for said dummy pattern layout.

10. The semiconductor integrated circuit photomask as claimed in claim 6, wherein said dummy pattern layout is formed by a matrix arrangement of the plurality of block patterns, each block pattern having a quadrate shape with sides having a respective length in a 1:1 proportion to define a predetermined optical density for said dummy pattern layout.

11. The semiconductor integrated circuit photomask as claimed in claim 1, wherein said dummy pattern layout is formed by a matrix arrangement of the plurality of block patterns, each block pattern having a rectangular shape with sides having a respective length in a 2:1 proportion to define a predetermined optical density for said dummy pattern layout.

12. The semiconductor integrated circuit photomask as claimed in claim 6, wherein the block patterns of the dummy pattern layout represent an optical density within 25%~45%.

13. A manufacturing method of a semiconductor integrated circuit first photomask having a first optical density corresponding to a second optical density of a second photomask for the semiconductor integrated circuit, the method comprising the steps of:

providing a formal pattern layout representing a formal pattern structure having a plurality of lines and an informal pattern space formed between neighboring lines of said plurality of lines for forming structures, said formal pattern layout defining a first partial optical density of the first photomask, said first partial optical density being smaller than said second optical density of said second photomask;

providing a dummy pattern layout including a plurality of block shaped patterns, said block shaped patterns defining an additional optical density for said first photomask;

combining said dummy pattern layout with said formal pattern layout to add said additional optical density to said first partial optical density of said first photomask, thereby defining a cumulative said first optical density of said first photomask substantially equal to said second optical density of said second photomask, said dummy pattern layout being mapped onto a region corresponding to said informal pattern spaces; and completing said first photomask with said combined formal pattern layout and dummy pattern layout.

14. The method as claimed in claim 13, wherein said step of providing a dummy pattern layout includes the step of forming said block shaped patterns as a matrix arrangement of patterns with a cross shape formed by rectangular shaped patterns with sides having a respective length in a 2:1 proportion.

15. The method as claimed in claim 13, wherein said step of providing a dummy pattern layout includes the step of forming said block shaped patterns as a staggered arrangement of patterns with a cross shape formed by rectangular shaped patterns with sides having a respective length in a 3:1 proportion.

16. The method as claimed in claim 13, wherein said step of providing a dummy pattern layout includes the step of forming said block shaped patterns as a matrix arrangement of patterns having a quadrate shape with sides having a respective length in a 1:1 proportion.

17. The method as claimed in claim 13, wherein said step of providing a dummy pattern layout includes the step of forming said block shaped patterns as a matrix arrangement of patterns having a quadrate shape with sides having a respective length in a 2:1 proportion.

18. The method as claimed in claim 13, wherein said step of providing a dummy pattern layout includes the step of forming said block shaped patterns to define said optical density within a range of 25%~45%.

* * * * *